United States Patent [19]

Hennig

[11] Patent Number: 5,568,050
[45] Date of Patent: Oct. 22, 1996

[54] METHOD OF MAGNETIC RESONANCE IMAGING TOMOGRAPHY FOR THE SIMULTANEOUS PRODUCTION OF A PLURALITY OF IMAGE SLICES

[76] Inventor: Jürgen Hennig, Johann-von-Weerth-Str. 12, D-79100 Freiburg, Germany

[21] Appl. No.: 510,611

[22] Filed: Aug. 3, 1995

[30] Foreign Application Priority Data

Aug. 27, 1994 [DE] Germany .................. 44 30 460.9

[51] Int. Cl.$^6$ .................................................. G01V 3/00
[52] U.S. Cl. ............................................................ 324/309
[58] Field of Search ................................... 324/300, 307, 324/309, 310, 311, 312, 313, 314, 318, 322; 128/653.2, 653.3

[56] References Cited

U.S. PATENT DOCUMENTS

| | | |
|---|---|---|
| 4,577,152 | 3/1986 | Macovski . |
| 4,884,029 | 11/1989 | Sattin ........................................ 324/309 |
| 5,237,273 | 8/1993 | Plewes et al. . |

FOREIGN PATENT DOCUMENTS

| | | |
|---|---|---|
| 0259935 | 3/1988 | European Pat. Off. ........ G01N 24/08 |
| 0373747 | 6/1990 | European Pat. Off. ........ G01R 33/56 |
| 0560168 | 9/1993 | European Pat. Off. ........ G01R 33/56 |
| 0637756 | 2/1995 | European Pat. Off. ...... G01R 33/483 |
| 3504734 | 8/1986 | Germany ........................ G01N 24/08 |
| 3823398 | 1/1990 | Germany ........................ G01N 24/08 |
| 4216969 | 11/1993 | Germany ........................ G01N 24/08 |

OTHER PUBLICATIONS

Journal of Magnetic Resonance, Series B 101, pp. 106–109 (1993): I. J. Lowe et al. "Dante Ultrafast Imaging Sequence" (DUFIS).

Magnetic Resonance Imaging of the Body, Raven Press, New York, p. 177ff. (1992): Higgins et al.

Magnetic Resonance in Medicine 29, p. 139ff (1993): Jens Frahm et al. "Functional MRI of Human Brain Activation at High Spatial Resolution".

Proc. Natl. Acad. Sci. USA, vol. 87 pp. 9868–9872 (1990): S. Ogawa et al. "Brain magnetic resonance imaging with contrast dependent on blood oxygenation".

Proc. XIIth Annual Meeting SMRM, New York, p. 13 (1993): Guoying Liu et al. "A Functional MRI Technique Combining Principles of Echo–Shifting with a Train of Observations (PRESTO)".

The British Journal of Radiology, vol. 66, No. 792, Dec. 1993 pp. 1177–1181: S. Zhao et al. "Simultaneous Multi-slice Imaging with an additional Slice Gradient in the . . . ".

*Primary Examiner*—Michael Tokar
*Attorney, Agent, or Firm*—Walter A. Hackler

[57] ABSTRACT

A method for the production and recording of nuclear magnetic resonance (NMR) signals in chosen regions of an investigational object with which, in an excitation step, a narrow band radio frequency (RF) pulse is irradiated into the investigational object in a homogeneous static magnetic field in the presence of a slice selection gradient $G_S$ in order to produce an NMR signal in a selected slice of the investigational object, and with which, in a recording step, the produced NMR signal is read-out in the presence of a read gradient $G_R$ which is perpendicular to the slice selection gradient $G_S$, is characterized in that, in a time interval between the excitation step and the recording step, further RF pulses are each irradiated in the presence of a slice selection gradient $G_S$ whereby, in the time intervals between the irradiation of the RF pulses, further gradient pulses are switched-in in the direction of the read gradient $G_R$ and the additional time-shifted sequential NMR signals thereby produced are read-out in the presence of the read gradient $G_R$. In this manner the overall recording time can be substantially reduced.

7 Claims, 4 Drawing Sheets

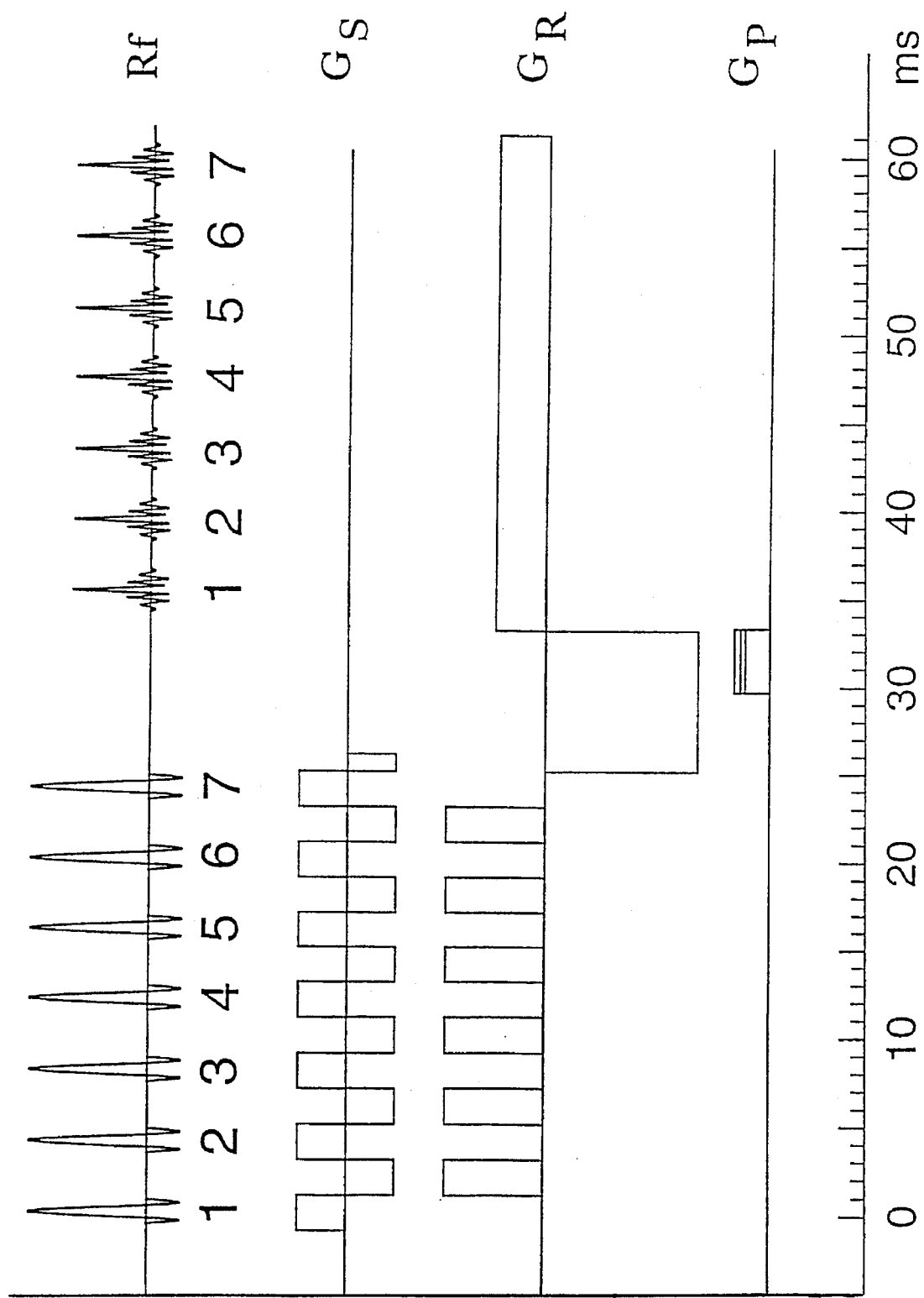

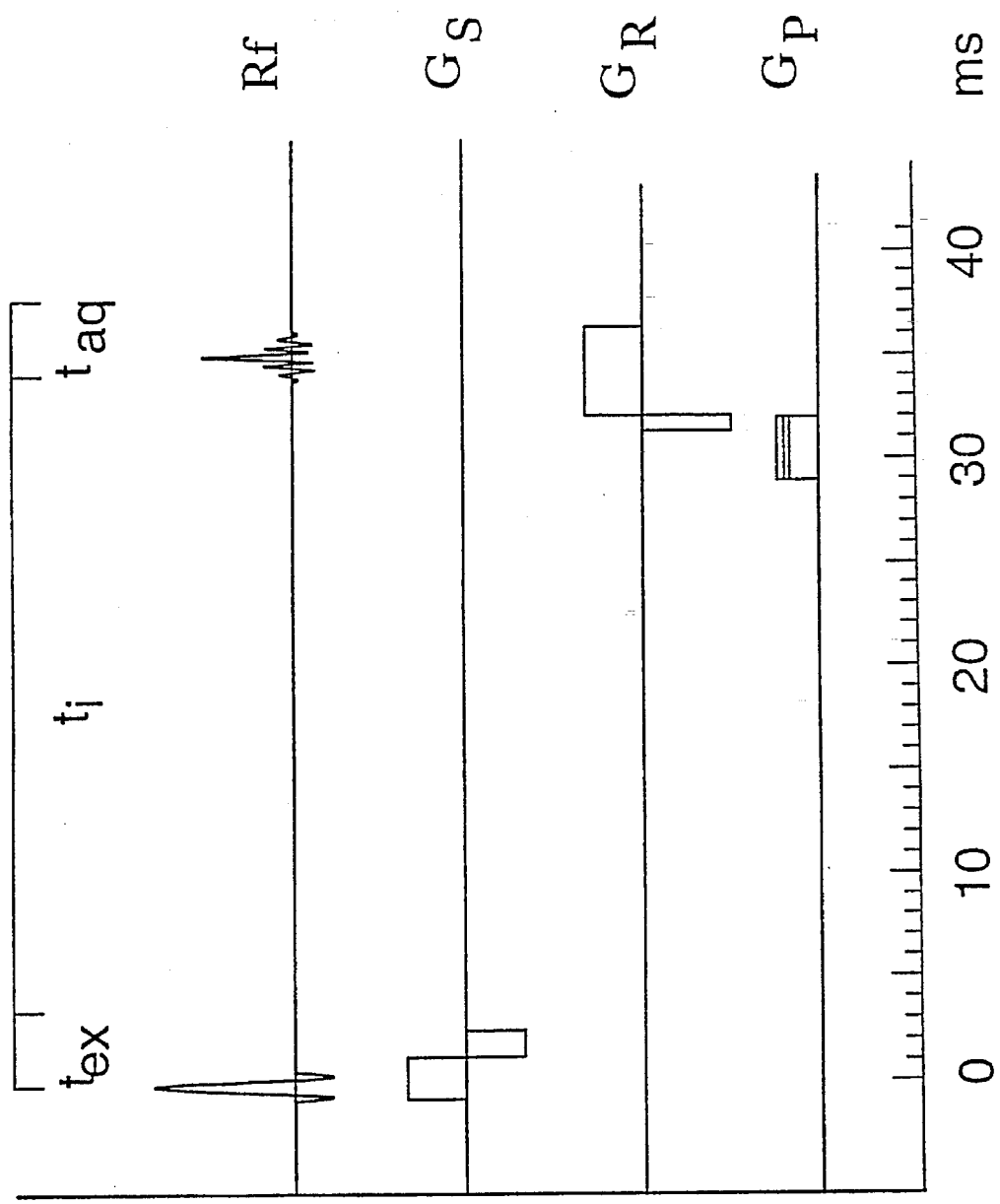

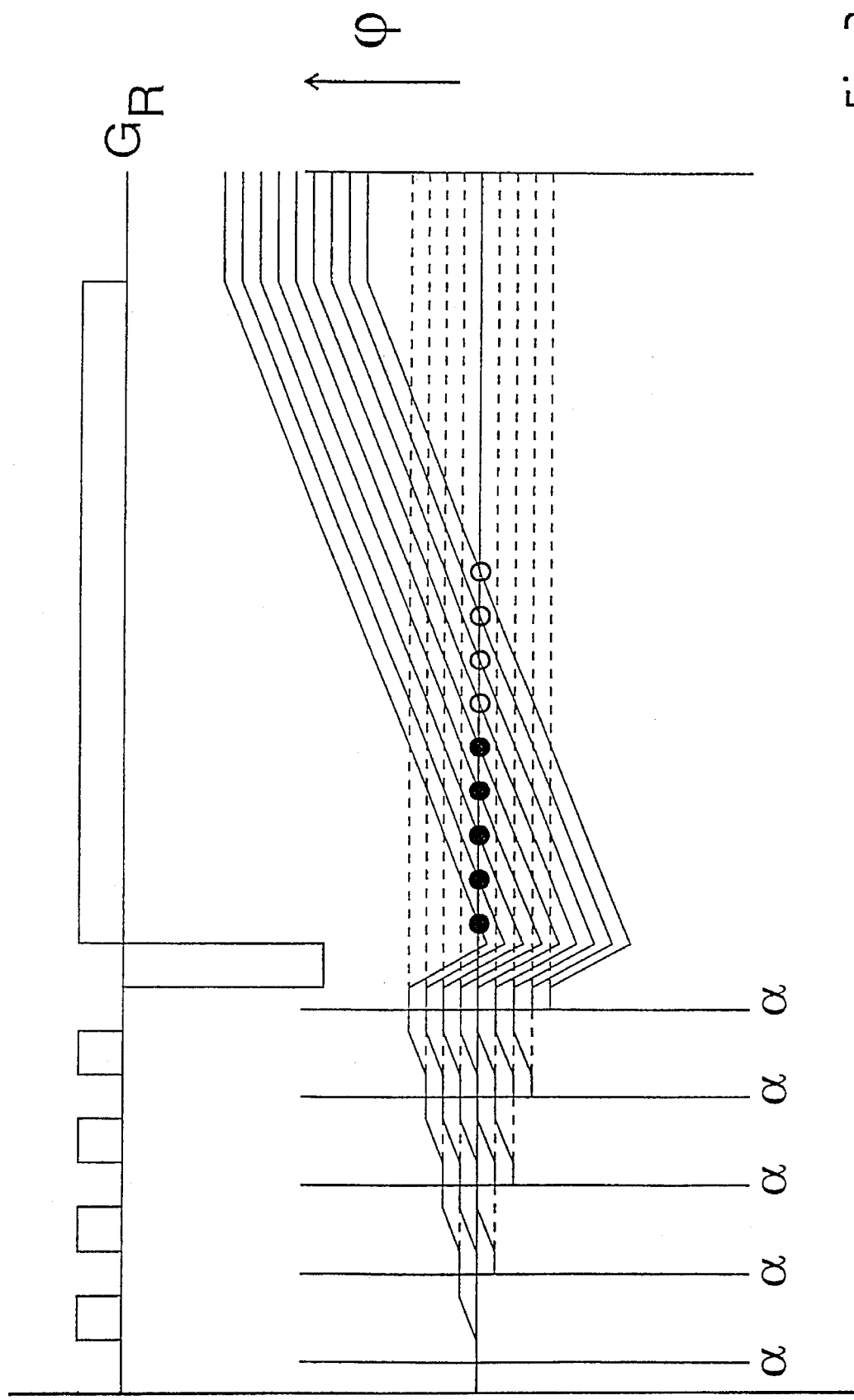

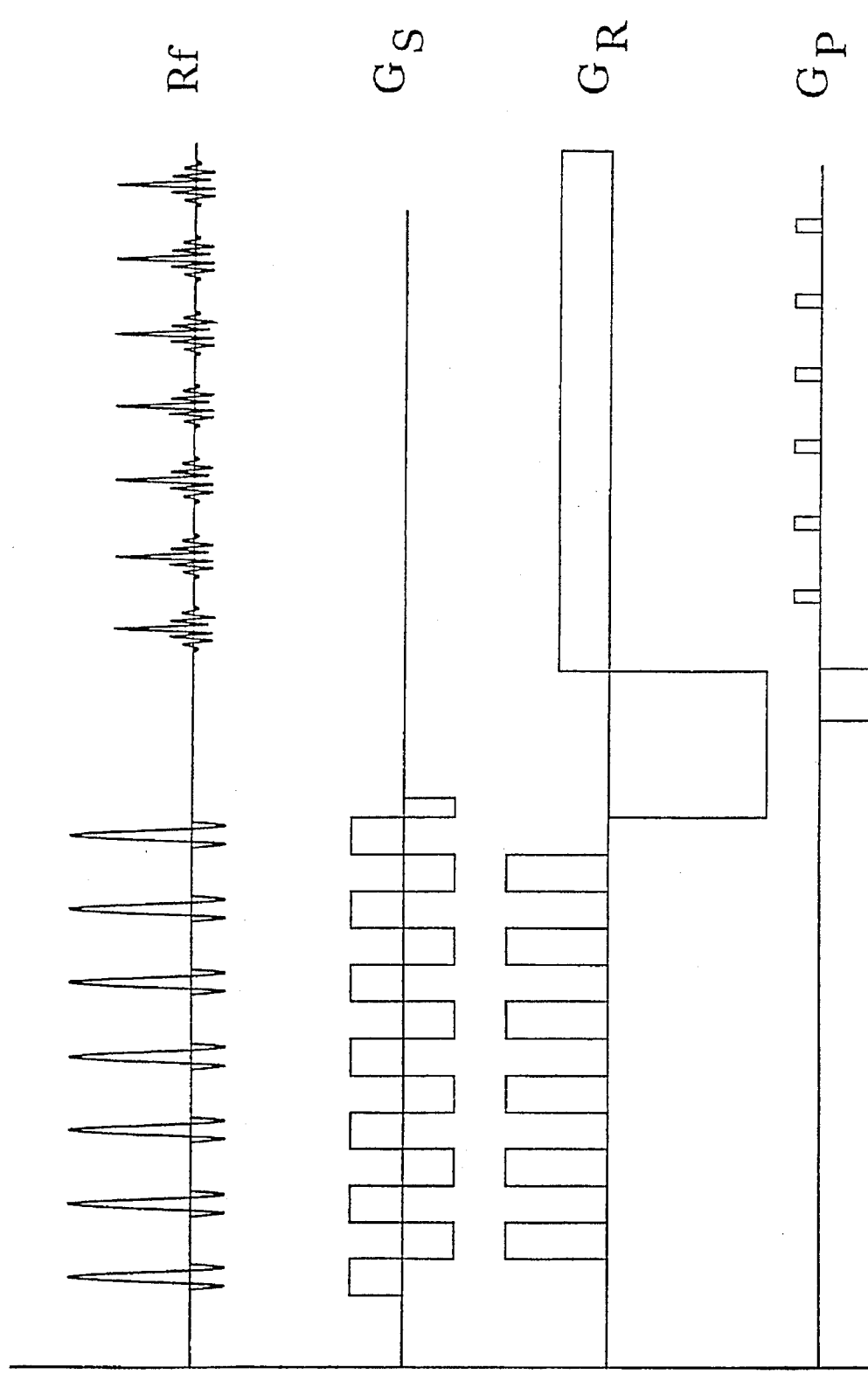

METHOD OF MAGNETIC RESONANCE IMAGING TOMOGRAPHY FOR THE SIMULTANEOUS PRODUCTION OF A PLURALITY OF IMAGE SLICES

BACKGROUND OF THE INVENTION

The invention concerns a method for the production and recording of nuclear magnetic resonance (NMR) signals in chosen regions of an investigational object, in particular for the production of slice images of a body with which, in an excitation step, a narrow band radio frequency (RF) pulse is irradiated into the investigational object in a homogeneous static magnetic field in the presence of a slice selection gradient $G_S$ in order to produce an NMR signal in a selected slice of the investigational object and with which, in a recording step, the produced NMR signal is read-out in the presence of a read gradient $G_R$ which is perpendicular to the slice selection gradient $G_S$.

A method of this kind is, for example, known in the art from DE 35 04 734 A1.

The production of nuclear magnetic resonance tomography images with the assistance of a gradient echo sequence is a method frequently used in clinical applications (see also: Higgins Ch, Hricak H, Helms C, Magnetic Resonance Imaging of the Body, Raven Press, New York, 1992, p. 177 ff.). In particular, the application of such a sequence to the investigation of signal changes occurring during activation of cortical areas has recently been shown to be useful (see Frahm, J. et al. Magnetic Resonance in Medicine 29: 139, 1993). Due to the BOLD contrast mechanism used herewith (see Ogawa, Set al. Proc.Natl.Acad.Sci. USA 89:5951, 1992), these investigations require a signal read-out with long echo times of 40–80 ms. Since the repetition time for the recording of sequential individual projection steps must necessarily be larger than the signal read-out time, recording times thereby result of ca. 10–20 s per image for a recording matrix of 128×256 to 256×256. A shortening of these recording times by about one half can be achieved by so-called echo-shifting, known in the art from Liu G. et al. (Proc.XIIth Annual Meeting SMRM, New York, p. 13, 1993).

It is therefore the purpose of the present invention to present a method of the above-mentioned kind with which the entire recording time can be further substantially reduced.

SUMMARY OF THE INVENTION

This purpose is achieved in accordance with the invention in a surprisingly simple but effective manner in that further RF pulses are each irradiated in the presence of a slice selection gradient $G_S$ in a time interval between the excitation step and the recording step, whereby, in the time intervals between the irradiation of the RF pulses, additional gradient pulses are switched-in in the direction of the read gradient $G_R$ and the additional sequential NMR signals thereby produced are read-out in a time displaced fashion in the presence of the read gradient $G_R$.

A variation of the method in accordance with the invention is particularly preferred with which, in a time interval between irradiation of the last RF pulse and the occurrence of the first produced NMR signal, a phase encoding gradient $G_p$, perpendicular to the read gradient $G_R$, is applied and the entire method is repeated a plurality of times with differing phase encoding gradients $G_p$ being applied in each case. In this fashion, the produced NMR signals are subjected to differing phase encodings from one cycle of the method to the next.

In a further preferred variation of the method in accordance with the invention, the strengths of the gradient are chosen in such a fashion that the NMR signals from the most differing slices of the investigational object each exhibit the same echo time with respect to their corresponding RF excitation pulse. Due to the equidistant time sequence of the NMR signals the recording and analysis procedures are substantially simplified.

In a preferred improvement of the method in accordance with the invention, an additional phase encoding gradient is applied in the direction of slice selection gradient $G_S$ and is varied under repetition of the method according to the principle of three dimensional Fourier transformation. In this fashion it is possible to further increase the spatial resolution of the NMR signals within each slice.

It is not absolutely necessary to utilize the method in accordance with the invention solely for the production of multiple slice NMR images.

The time displaced NMR signals of chosen observed slices can each be differently phase-encoded. A reduction in the number of recording steps is thereby achieved so that a substantial reduction in the measuring time is possible.

Further advantages of the invention can be extracted from the description and the drawing. The above-mentioned features as well as those to be described further below in accordance with the invention can be utilized individually or collectively in arbitrary combination. Embodiments shown and described are not to be considered as exhaustive enumeration rather have exemplary character only for illustration of the invention.

BRIEF DESCRIPTION OF THE DRAWING

FIG. 1 shows a gradient echo sequence in accordance with the invention for the simultaneous read-out of NMR signals from a plurality of slices;

FIG. 2 shows a gradient echo sequence according to prior art;

FIG. 3 shows a diagram of the time development of the phase φ of a spin system in the presence of a time changing read gradient $G_R$ under application of excitation RF pulses of flip angles α; and FIG. 4 shows a sequence in accordance with the invention for the production of a plurality of differing phase encoding signals in the same slice.

DESCRIPTION OF THE PREFERRED EMBODIMENT

In the conventional gradient echo sequence shown in FIG. 2 $G_S$ corresponds to the slice selection gradient, $G_R$ the read gradient and $G_p$ the phase encoding gradient whereas Rf designates the excitation radio frequency pulse as well as as the NMR signal produced thereby. For a typical experiment having an echo time of 35 ms the slice selection interval $t_{ex}$, the read interval $t_{aq}$ and the intermediate time $t_i$ are indicated.

The underlying principle of the method in accordance with the invention is based on the realization that, for the desired application of the conventional NMR gradient echo sequence according to FIG. 2 having longer echo times, a long time interval $t_i$ occurs between the production of the NMR signals by a slice selective radio frequency pulse in the presence of a slice selection gradient $G_S$ and the signal read-out in the form of a gradient echo by means of inversion of read gradient $G_R$.

This time interval $t_i$ is filled in the method in accordance with the invention by additional excitation steps of the kind described, whereby these additional excitation steps each generally involve differing slices. Due to the introduction of gradients in the direction of the read gradient $G_R$, it is possible to sequentially record NMR signals caused by the differing excitation pulses during the read-out period, whereby, for a suitable choice of the strength of this additional gradient, each NMR signal has the same echo time relative to its excitation pulse.

The numbers indicated in FIG. 1 below the RF pulses or the RF signals correlate the NMR signals to the corresponding associated selection pulses. In the method of the invention according to FIGS. 1, 3, and 4 a plurality of different slices are excited by changing the frequency of the RF excitation pulse for a given fixed applied slice selection gradient field. Alternatively, the RF excitation pulse frequency can be kept constant and different slices excited by overlapping a constant magnetic field of changeable magnitude upon the slice selection gradient field.

The number of excitation steps which can be applied in the interval for a given echo time $t_e$ depends on the duration of an excitation interval $t_{ex}$ as well as that of a read-out step $t_{aq}$. For conventional gradient systems with switching times less than 1 ms and strengths of more than 10 mT/m values of $t_{ex}=4$ ms and $t_{aq}=4$ ms are easily achieved as shown in FIG. 1. It is thereby possible to accommodate 7 slices in the measuring interval for an echo time of 35 ms. Due to the sequential read-out of the NMR signals, the minimum repetition time in the example shown is extended from approximately 40 ms to approximately 60 ms. The savings in time therefore assumes a value of approximately a factor of 4.7 compared to a sequential recording of individual slices or compared to a nested recording in accordance with the multi-slice principle.

The sequence in accordance with the invention is utilized when the individual excitation steps shown in FIG. 1 correspond to a plurality of slices or to a single slice. In this case one must take into consideration that the sequential NMR signals are not only to be viewed as pure gradient echoes, rather spin echoes or stimulated echo signals caused by two or a plurality of sequential excitation pluses are also to be taken into consideration. As shown in FIG. 3, the corresponding NMR signal portions each coherently overlap in the application scheme shown in FIG. 1 so that artifact free images result.

FIG. 3 shows, in detail, the development phase $\phi$ of a spin system in the presence of a time changing read gradient $G_R$ under the application of a total of five excitation pulses of flip angle $\alpha$ represented by perpendicular lines. In addition to the gradient echo signals (filled circles) which also occur when utilizing excitation pulses and with which differing slices can be chosen, spin echo NMR signals designated with open circles also hereby result.

A particularly preferred application of this implementation of the sequence is to provide each of the individually occurring NMR signals with differing phase encoding so that a reduction of the measurement time by the above mentioned factor is possible.

A sequence for the excitation of a plurality of differing phase encoding signals of this kind is shown in FIG. 4.

I claim:

1. A method for the production and recording of NMR signals in chosen regions of an investigational object comprising the steps of:
   a) applying a first slice selection gradient having a slice selection gradient direction;
   b) irradiating a first narrow band RF pulse in the presence of the first slice selection gradient to produce an first NMR signal in a first selected slice of the investigational object;
   c) applying a first read gradient having a read gradient direction perpendicular to the slice selection gradient direction;
   d) applying an additional slice selection gradient;
   e) irradiating an additional narrow band RF pulse in the presence of the additional slice selection gradient to produce an additional NMR signal in an additional selected slice of the investigational object;
   f) applying an additional read gradient;
   g) applying a final slice selection gradient;
   h) irradiating a final narrow band RF pulse in the presence of the final slice selection gradient to produce a final NMR signal in a final selected slice of the investigational object;
   i) applying a final read gradient; and
   j) reading out, in time sequence and in the presence of the final read gradient, the first, additional, and last NMR signals.

2. The method of claim 1, further comprising repeating steps d) through f) a plurality of times to obtain a plurality of additional NMR signals.

3. The method of claim 1, further comprising the steps of
   h') applying, following step h) and preceding step j), a first phase encoding gradient having a phase encoding gradient direction perpendicular to the read gradient direction;
   k) repeating steps a)–j) a plurality of times including, for each repetition, application of a changed phase encoding gradient in step h').

4. The method of claim 1, further comprising the step of selecting the first, additional, and last slice selection and read gradients so that a first time difference between the first RF pulse and the first NMR signal equals an additional time difference between the additional RF pulse and the additional NMR signal.

5. The method of claim 3, further comprising the step of applying, in accordance with the method of three dimensional Fourier transformation, a variable additional phase encoding gradient in the slice selection gradient direction.

6. The method of claim 1, further comprising the step of differently phase encoding the first, additional, and last selected slices.

7. The method of claim 1 wherein step e) is performed before reading the first NMR signal.

* * * * *